(12) United States Patent
Sasakura

(10) Patent No.: US 7,325,179 B2
(45) Date of Patent: Jan. 29, 2008

(54) STORAGE SYSTEM COMPRISING LOGICAL CIRCUIT CONFIGURED IN ACCORDANCE WITH INFORMATION IN MEMORY ON PLD

(75) Inventor: Takahiro Sasakura, Chigasaki (JP)

(73) Assignee: Hitachi, Ltd., Tokyo (JP)

( * ) Notice: Subject to any disclaimer, the term of this patent is extended or adjusted under 35 U.S.C. 154(b) by 178 days.

(21) Appl. No.: 11/250,436

(22) Filed: Oct. 17, 2005

(65) Prior Publication Data

US 2007/0050689 A1    Mar. 1, 2007

(30) Foreign Application Priority Data

Aug. 23, 2005   (JP) .............................. 2005-241198

(51) Int. Cl.
G11C 29/00 (2006.01)
G01R 31/28 (2006.01)

(52) U.S. Cl. ..................................... 714/718; 714/725

(58) Field of Classification Search ................ 714/725, 714/718
See application file for complete search history.

(56) References Cited

U.S. PATENT DOCUMENTS 6,009,548 A * 12/1999 Chen et al. ................. 714/762

2006/0117234 A1 * 6/2006 Miyake et al. .............. 714/725

FOREIGN PATENT DOCUMENTS

JP         8-137764         5/1996

* cited by examiner

Primary Examiner—James C. Kerveros
(74) Attorney, Agent, or Firm—Mattingly, Stanger, Malur & Brundidge, P.C.

(57) ABSTRACT

The storage system includes a PLD (Programmable Logic Device), which controls data transfer between another device and a media drive; and a processor. The PLD includes a memory for storing information input from an information source located externally to the PLD; a circuit element group including a plurality of circuit elements; and a logical circuit configured on the circuit element group in accordance with the information in the memory. The processor detects whether a soft error has occurred in the memory, detects whether or not an error has occurred in the logical circuit, and implements control in accordance with the results of the two detection operations.

8 Claims, 8 Drawing Sheets

STORAGE SYSTEM COMPRISING LOGICAL CIRCUIT CONFIGURED IN ACCORDANCE WITH INFORMATION IN MEMORY ON PLD

CROSS-REFERENCE TO PRIOR APPLICATION

This application relates to and claims priority from Japanese Patent Application No. 2005-241198, filed on Aug. 23, 2005 the entire disclosure of which is incorporated herein by reference.

FIELD OF THE INVENTION

The present invention relates to technology for controlling a device provided with a logical circuit configured in accordance with information in a memory on a PLD (Programmable Logic Device)

BACKGROUND OF THE INVENTION

Conventionally, it is known that information in a memory can be corrupted (for instance, a bit stating "1" may change to "0"), in other words, a soft error may occur, due to a cause such as an α beam or a neutron beam being irradiated onto the memory (see, for example, Japanese Patent Laid-open No. 8-137764).

A type of PLD is known which allows configuration of a logical circuit having a configuration indicated by circuit configuration information contained in a memory (information indicating the configuration of the logical circuit). One type of a PLD of this kind is an FPGA (Field Programmable Gate Array). An FPGA comprises, for example, a circuit element group comprising a plurality of circuit elements, and a memory for configuring a logical circuit on this circuit element group (hereinafter, called a "configuration memory"). A logical circuit having a configuration indicated by the circuit configuration information in the configuration memory is configured on the circuit element group. If a soft error occurs in the configuration memory, then the circuit configuration information in the case of the soft error will be different from the initial information, and there is a possibility that the logical circuit in the FPGA may be rewritten with a circuit having an unintended configuration.

Recently, there have been advances in the miniaturization and capacity of FPGAs, and accordingly, it has become possible to miniaturize the configuration memory, also. Therefore, the information in the configuration memory becomes more liable to the effects of radiation, and there is a possibility that the occurrence rate of soft errors may increase. Consequently, it has become impossible to ignore the occurrence of soft errors.

An FPGA may be fitted with an error monitoring function which checks whether or not a soft error has occurred in the configuration memory. When a soft error has occurred according to this error monitoring function, then the occurrence of a soft error is reported.

Soft errors that occur may or may not have an actual effect on the configured logical circuit. However, regardless of this, if a soft error has occurred according to the error monitoring function installed in the FPGA, then the occurrence of a soft error is reported. Therefore, it is not possible to implement control in accordance with whether or not an occurring soft error actually has an effect on the configured logical circuit. For example, one method for recovering from a soft error is a method in which the main power supply of the device in which the FPGA is installed is temporarily switched off and the main power supply of that device is then switched on again. However, if the main power supply is switched off each time a soft error occurs, then the usability of the device will be poor. This method is particularly undesirable in cases where the device in which the FPGA is installed is a device which does not permit a long-term halt in operation (namely, a "non-stop device"), and more specifically, for example, a storage system which is required to operate 24 hours a day.

SUMMARY OF THE INVENTION

Therefore, one object of the present invention is to enable a device having a logical circuit configured in accordance with information in a memory located on a PLD to be controlled in a manner which restricts reduction in the throughput of the device in the event of a soft error in the memory.

Other objects of the present invention will become apparent from the following description.

The storage system according to the present invention comprises a media drive which is capable of storing data that is sent to and received from another device, a PLD which controls data transfer between the other device and the media drive, and a processor (for example, a microprocessor). The PLD comprises a memory capable of storing circuit configuration information indicating the configuration of a logical circuit, input from an information source located externally to the PLD, a circuit element group comprising a plurality of circuit elements, and a logical circuit for control data transfer, which is configured on the circuit group element in accordance with the circuit configuration information in the memory. The processor detects whether a soft error has occurred in the memory, detects whether or not an error has occurred in the logical circuit, and implements control on the basis of the results of the two detection operations. Stated alternatively, instead of a processor, the storage system may comprise a first detection device which detects that a soft error has occurred in the memory, a second detection device which detects whether or not an error has occurred in the logical circuit, and a control device which implements controls in accordance with the results of the two detection operations.

The other device may be, for example, a host device, or another storage system.

Furthermore, any type of information source may be used, provided that it is more resistant to the effects of radiation than the memory. For example, it may be another memory apart from the aforementioned memory, or it may be a computer machine which is connected to the storage system in a communicable fashion.

The occurrence of a soft error in the memory can be detected by means of an interrupt signal from the memory, for example. This interrupt signal may be issued, for example, by an error monitoring function which checks whether or not a soft error has occurred in the memory.

The occurrence of an error in the logical circuit can be detected by determining whether or not an error report has been output from the logical circuit. In this case, the logical circuit may comprise, for example, an error checking circuit which checks whether or not an error has occurred in the logical circuit and output an error report if an error is detected.

The storage system according to the present invention may be a system provided with a plurality of media drives, or it may be a server machine. The storage system may also be a so-called "fault-tolerant system".

In the first mode of the present invention, the processor (or control device) is able to halt the transfer of data carried out via the logical circuit when a soft error or error report has been output. Furthermore, the processor (or control device) is able to cause circuit configuration information in the memory to be read into the memory and to reconfigure the logical circuit in accordance with the circuit configuration information read into the memory. In this case, the processor (or control device) is able to restart the transfer of data, if a soft error has not been detected after a prescribed time period has elapsed since the reconfiguration of the logical circuit. Furthermore, the processor (or control device) is able to instruct the replacement of the PLD or a circuit board on which the PLD is provided, if the occurrence of a soft error in the memory has been detected within the prescribed time period after reconfiguration of the logical circuit. Here, the circuit board may be an interface control board (for example, a CHA or DKA as described below) provided with an PLD. Furthermore, the instruction for replacement of the circuit board may be issued, for example, by indicating that replacement is necessary on a display screen provided in a device which is connected in a communicable fashion with the storage system.

In a second mode of the present invention, the processor (or control device) is able to halt the transfer of data carried out via the logical circuit, if a soft error or error report is output. Moreover, the processor (or control device) is able to carry out invalidation processing in order to invalidate particular which has been transmitted and received up to the detection of the soft error from a time prior to the detection of the soft error by the prescribed time period. Here, "invalidation processing" means, for example, reporting which data is the particular data, to the other device, and requesting the other device to resend the particular data to the storage system, or to erase the particular data from the other device. Alternatively, "invalidation processing" means erasing the particular data from the media drive, from among the data received from the other device and written to the media drive, for example.

In a third mode of the present invention, the processor (or control device) is able to write the fact that a soft error has occurred, to a prescribed storage area, when a soft error has been detected but an error in the logical circuit has not been detected.

In a fourth mode of the present invention, it is possible for data transfer systems provided with the PLD and the processor to be multiplexed. If the processor in a certain data transfer system has detected the soft error, then it may halt the transfer of data carried out via the logical circuit. Even if data transfer has been halted in the certain data transfer system, the other data transfer system is able to perform data transfer via the logical circuit in the other data transfer system.

The control method according to the present invention is a control method for a device having a PLD comprising: a memory for storing information input from an information source located externally to the PLD; a circuit element group comprising a plurality of circuit elements; and a logical circuit configured on the circuit element group in accordance with the information in said memory. In this control method, it is detected whether a soft error has occurred in the memory, and whether or not an error has occurred in the logical circuit, and control is implemented in accordance with the results of the two detection operations.

This control method may be implemented, for example, by reading in and executing a computer program in a computer. The computer program may be recorded on a storage medium, such as a CD-ROM, or the like. In this case, the computer may read in and install the computer program from the storage medium. Furthermore, the computer program may be downloaded to the computer via a communications network, such as the Internet. Moreover, the computer may be a processor, such as a CPU, or it may be an information processing device provided with a CPU, memory, or the like (for example, a personal computer, a server machine, or a work station)

DETAILED DESCRIPTION OF THE PREFERRED EMBODIMENT

Figure 1:
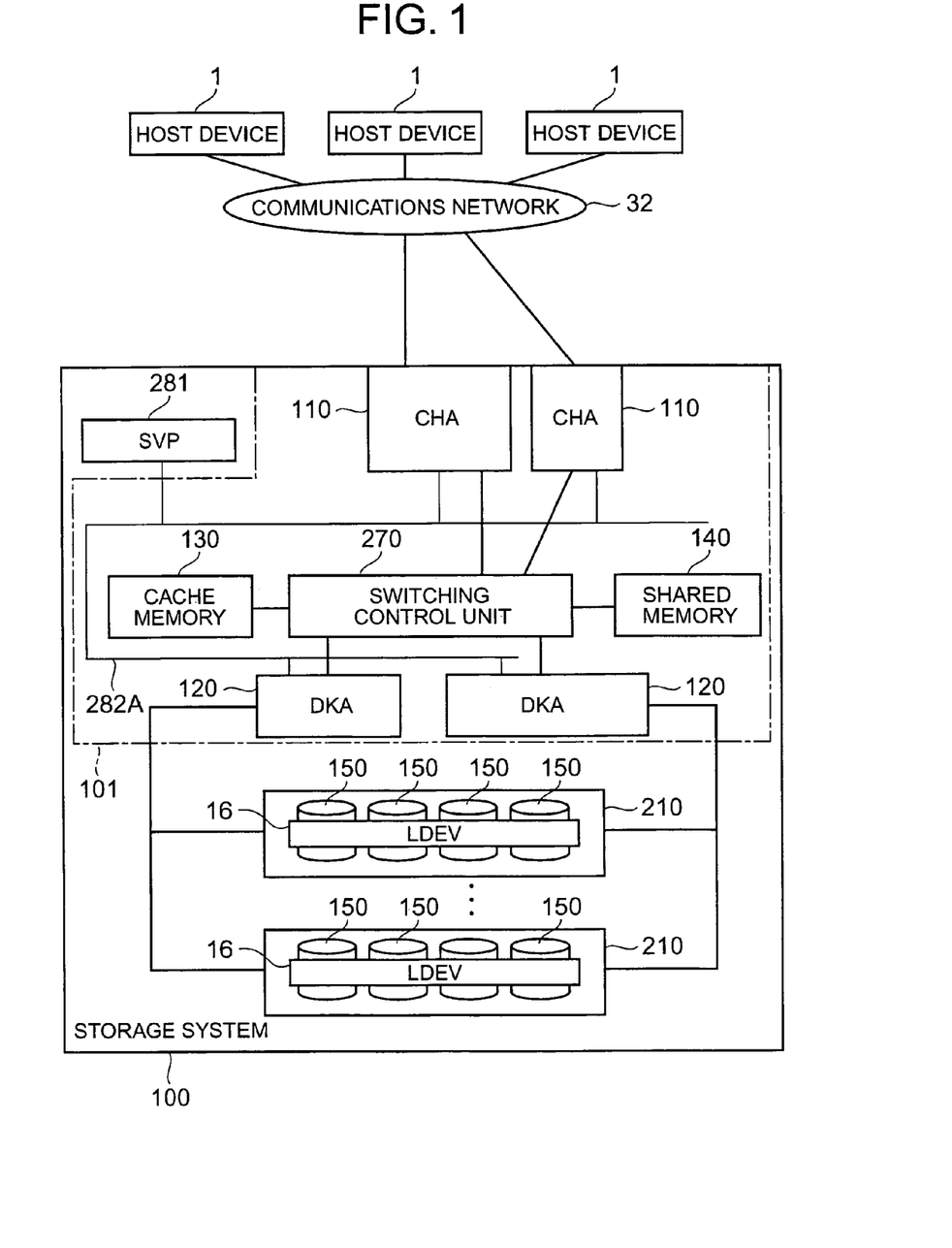
FIG. 1 is a block diagram showing an approximate view of a storage system relating to one embodiment of the present invention.

FIG. 1 is a block diagram showing the general configuration of a storage system relating to one embodiment of the present invention.

The storage system 100 is connected in a communicable fashion with a plurality of host computers 1, 1, . . . (or one host computer 1), via a communications network (for example, a SAN (Storage Area Network)) 32.

The storage system 100 is a disk array device, such as a RAID (Redundant Array of Independent Disks), for example. The storage system 100 comprises, for example, a control unit 101 for controlling the processing carried out by the storage system 100, a RAID group 210, and a service processor (SVP) 281. The control unit 101 comprises, for example, one or a plurality of disk adapters (hereinafter, "DKA") 120, one or a plurality of channel adapters (hereinafter, "CHA") 110, a cache memory 130, a shared memory 140 and a switching control section 270.

The RAID group 210 comprises a plurality of HDD (hard disk drives) 150; for example, it provides redundant storage based on a RAID, such as a RAID1 or RAID5 system. At least one or more logical devices (hereinafter, "LDEV") 6 forming logical storage regions can be set in the physical storage regions provided by the respective HDDs 150. A LDEV 6 is able to store data which can be rewritten by a host device 1.

The respective DKAs 120 control data transmission and reception to and from the respective HDDs 150. Each of the DKAs 120 may be constituted by a microcomputer system comprising a microprocessor (hereinafter, "MP"), ROM, RAM, and the like, for example.

Each CHA 110 has at least one port capable of connected to the communications network 32, and hence is able to receive data from the host devices 1. Similarly to the DKAs 120, the CHAs 110 may be configured as microcomputer systems comprising an MP, ROM, RAM and the like.

The cache memory 130 may be constituted by a volatile or non-volatile semiconductor memory, for example. The cache memory 130 is able to store data from the host devices 1 and data read from the LDEVs 6.

The shared memory 140 may be constituted by a non-volatile or volatile semiconductor memory, for example. The shared memory 140 stores, for example, various commands received from a host device 1, and control information, and the like, used to control the storage system 100. The commands and control information, and the like, may be stored in a redundant fashion by means of a plurality of shared memories 140. The cache memory 130 and the shared memory 140 may be constructed as mutually separate memories, or alternatively, a portion of a single memory may be used as a cache memory region and another portion of the same memory may be used as a shared memory region.

The switching control section 270 provides mutual connections between the various DKAs 120, the CHAs 110, the cache memory 130, and the shared memory 140. The switching control section 270 may be constituted by an ultra-high-speed cross-bar switch, or the like, for example.

The SVP 281 is a device (such as a notebook-type personal computer) provided with an input device or output device (such as a display screen), which is able to store prescribed control information in a prescribed storage region of the storage system 100 (such as the shared memory 140), by means of an internal network (such as a LAN) 282A, for example.

Next, one example of the processing carried out by the storage system 100 will be described. The CHA 110 receives a write request and data to be written (write data), from the host device 1, via the communications network 32. The write request thus received is stored in the shared memory 140, and the write data thus received is stored in the cache memory 130. The DKAs 120 refer to the shared memory 140 at regular intervals. When a DKA 120 discovers an unprocessed write request stored in the shared memory 140, it reads out the write data from the cache memory 130, and performs address conversion, and the like, in accordance with the write request. The DKA 120 writes the write data to an HDD 150 having the LDEV 6 designated by the write request.

Here, the processing of a read request from a host device 1 will be described. When a CHA 110 receives a read request from a host device 1, it stores this read request in the shared memory 140. If a DKA 120 discovers an unprocessed read request in the shared memory 140, then it reads out data from the HDD 150 having the LDEV 6 designated by the read request. The DKA 120 stores the data thus read out in the cache memory 130. Furthermore, the DKA 120 reports that read out of the requested data has been-completed, to the CHA 110, via the shared memory 140. The CHA 110 reads in data from the cache memory 130 and transmits this to the host device 1.

The foregoing was an example of the hardware configuration of the whole system relating to the present embodiment.

The particular feature of the storage system 100 according to this embodiment lies in the control that is carried out in the CHAs 110 and/or DKAs 120, which are interface control boards. The CHAs 110 and DKAs 120 are able to implement substantially the same control, and therefore, a CHA 110 is taken as a representative example in the following description of the characteristic control features.

Figure 2:
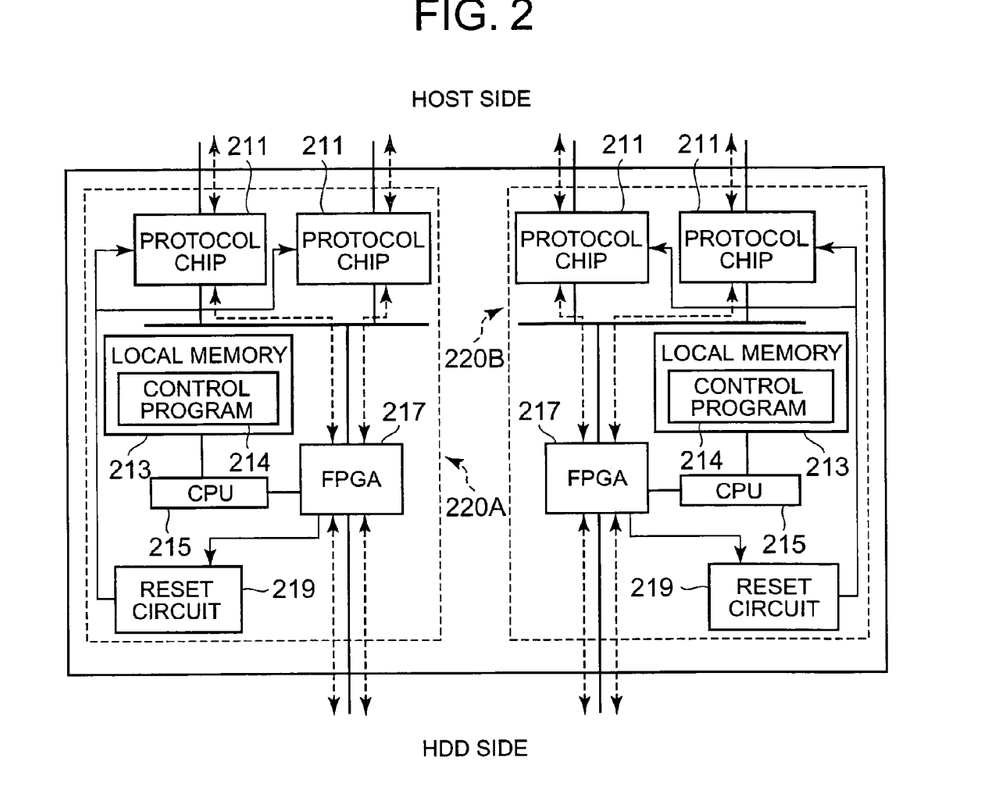
FIG. 2 shows an example of the hardware configuration of a CHA 110.

FIG. 2 shows an example of the hardware configuration of the CHA 110.

Data transfer systems 220A and 220B arranged in a dual layer are provided in the CHA 110. The data transfer systems 220A and 220B are able to control the transfer of data exchanged between the host devices 1 and the HDDs 150, simultaneously.

Since the data transfer systems 220A and 220B have substantially the same configuration, one data transfer system 220A is described here as a representative example: namely, one data transfer system 220A comprises a protocol chip 211, an FPGA (Field Programmable Gate Array) 217, a local memory 213, a CPU 215 and a reset circuit 219. The protocol chip 211 is a LSI (Large Scale Integration) circuit which converts protocols when sending or receiving data to or from a host device 1. The FPGA 217 is an LSI circuit which performs data transfer. The local memory 213 is able to store various information, for example, a control program 214 for causing the CPU 215 to execute prescribed control procedures. The CPU 215 is able to read in and execute a control program 214 from the local memory 213. The reset circuit 219 is able to control the implementation and halting of data input and output via the protocol chip 211, in accordance with a signal from the FPGA 217.

Figure 3:
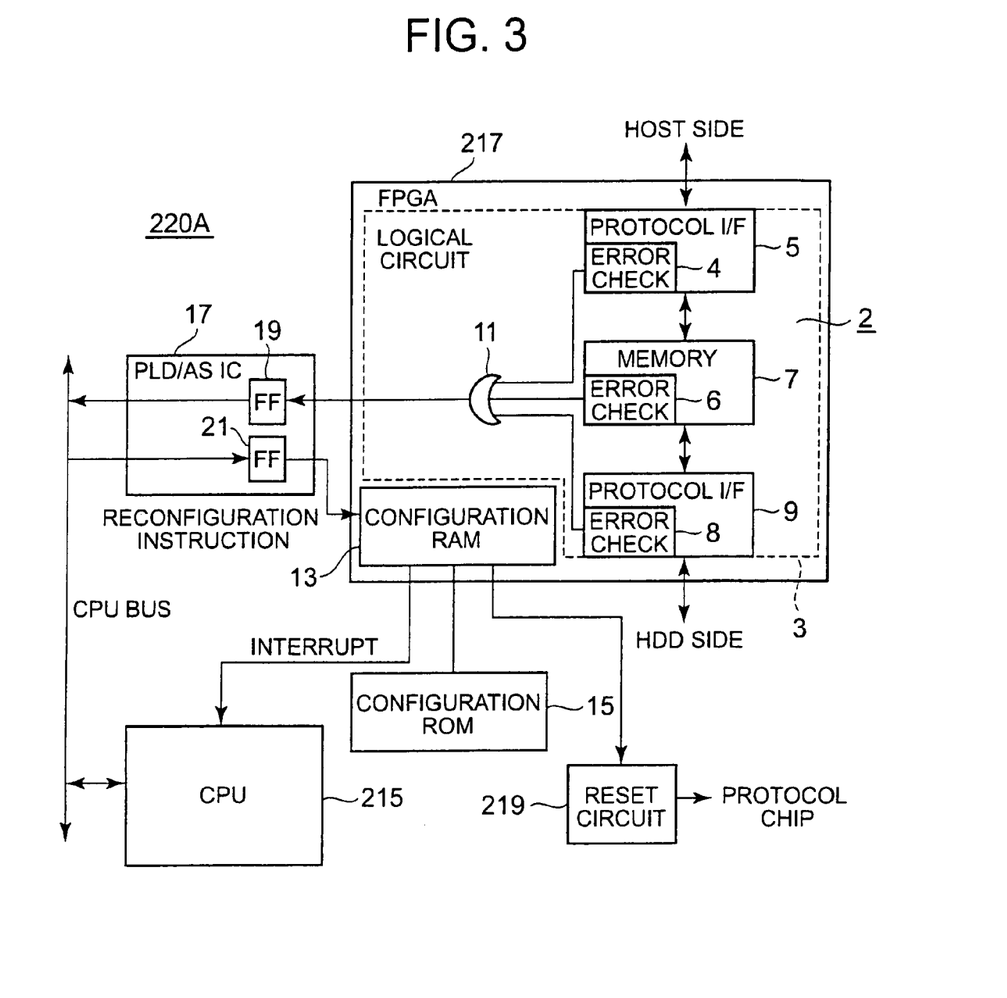
FIG. 3 is a block diagram showing a more detailed view of an example of the configuration of a data transfer system 220A.

FIG. 3 is a block diagram showing a more detailed view of an example of the configuration of the data transfer system 220A.

An ASIC (Application Specific Integrated Circuit) which is one type of PLD (hereinafter, called "PLD/ASIC" 17), and a configuration ROM 15 is provided in the data transfer system 220A, and each of these elements are connected to the FPGA 217.

The PLD/ASIC 17 is provided, for example, with a first flip-flop circuit (hereinafter, "FF") which accumulates error reports (described later) output by the FPGA 217, and a second FF 21 which accumulates a reconfiguration instruction input from the CPU 215 via the CPU bus.

The configuration ROM 15 is a memory which forms a source of circuit configuration information which indicates the configuration of a logical circuit (any type of memory may be used for this memory, provided that it is a non-volatile memory), and it stores circuit configuration information. The configuration ROM 15 is more liable to the effects of radiation than the configuration RAM 13 installed in the FPGA 217.

The configuration RAM 13 and a circuit element group 3 comprising a plurality of circuit elements (for example, printed wiring, semiconductor switches (for instance, transistors), and the like) are provided in the FPGA 217.

Circuit configuration information is read out from the configuration ROM 15 and stored in the configuration RAM 13.

A logical circuit 2 having the configuration indicated by the circuit information element stored in the configuration RAM 13 is configured on the circuit element group 3. Subsidiary circuits are provided in the configured logical circuit 2, such as an OR circuit 11, a first protocol interface circuit (hereinafter, "protocol I/F") 5 which controls the protocol of the data input and output from and to the host device 1 side, a second protocol I/F 9 which controls the protocol of the data input and output from and to the HDD 150 side, and a memory 7 which stores data exchanged between the first protocol I/F 5 and the second protocol I/F 9. The subsidiary circuits 5, 7 and 9 are provided respectively with error checking circuits 4, 6 and 8 which check whether or not an error has occurred in that subsidiary circuit 5, 7, or 9. The error checking circuits 4, 6, and 8 are connected to the OR circuit 11, and if it is detected that an error has occurred, then an error report (a signal indicating "1", for example) is input to the OR circuit 11. The OR circuit 11 is connected to the first FF 19 of the PLD/ASIC 17, and if an error report is input from at least one of the error checking circuits 4, 6, or 8, then an error report (such as a signal indicating "1") is output to the first FF 19. Consequently, an error report is stored in the first FF 19 (for example, a flag indicating the presence or absence of an error is raised).

Figure 4:
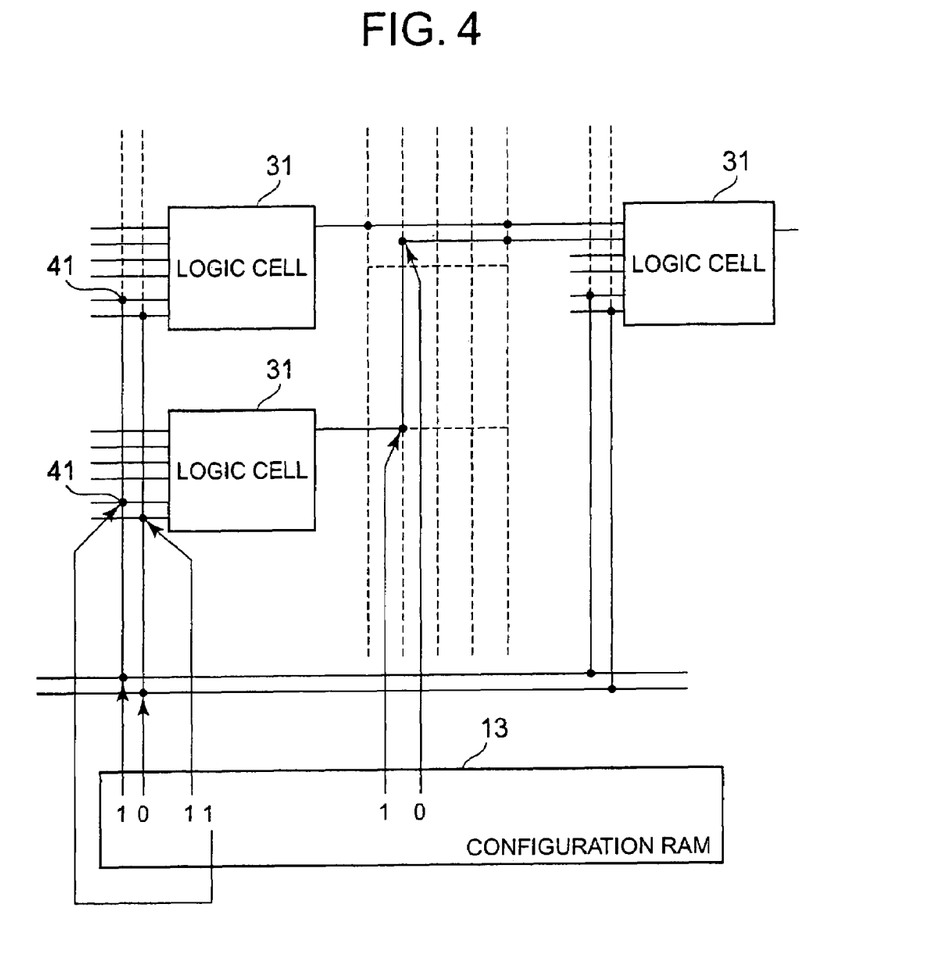
FIG. 4 shows a more detailed view of an example of the configuration of a logical circuit 2.

FIG. 4 shows a more detailed view of an example of the configuration of the logical circuit 2.

Figure 5:
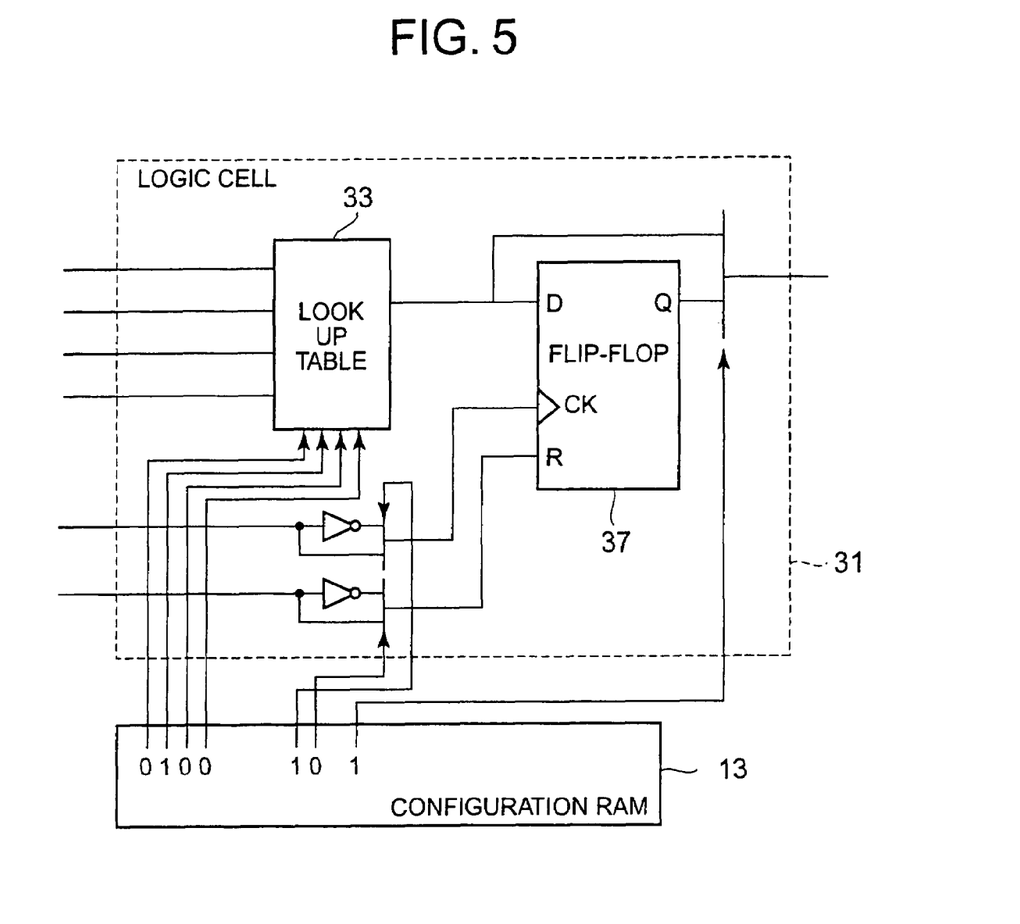
FIG. 5 shows an example of the configuration of a logic cell 31.

A plurality of logic cells 31 are configured on the circuit element group 3, in accordance with the circuit configuration information stored in the configuration RAM 13. The logic cells 31 are one element of the logical circuit 2 and they carry out at least one of the various types of processing performed by the logical circuit 2. The aforementioned subsidiary circuits 5, 7 and 9 are constituted by a group of at least one or more logic cells 31. FIG. 5 shows an example of the configuration of a logic cell 31. In the example shown in FIG. 5, a logic cell 31 is configured in accordance with the circuit configuration information, which controls a lookup table 33 and FF 37 located inside the logic cell 31, an FF 37, the signal values input to the FF 37, and the like.

The description returns now to FIG. 4. The circuit configuration information stored in the configuration RAM 13 is used to control which logic cell 31 is to be connected electrically to which other logic cells 31 in the circuit element group 3. More specifically, a semiconductor switch (for example, a transistor) 41, is provided between each of the logic cells 31 and the other logic cells 31, in order to control whether or not the logic cells 31 are connected electrically to each other. The circuit configuration information in the configuration RAM 13 controls whether the semiconductor switches 41 are to be switch on or off, by means of values set corresponding to the semiconductor switches 41 (for instance, whether the value is set to "1" or "0").

In this way, a logical circuit 2 such as that shown in FIG. 3 is configured.

The FPGA 217 is provided with an error monitoring function for checking whether or not a soft error has occurred (in other words, whether or not at least one of the bits constituting the circuit configuration information has been corrupted) in the configuration RAM 13. This error monitoring function checks whether or not a soft error has occurred in the configuration RAM 13, at regular or irregular intervals (for example, once every 100 milliseconds). If it is detected by the error monitoring function that a soft error has occurred in the configuration RAM 13 then an interrupt signal is input from the configuration RAM 13 to the CPU 215.

Furthermore, as described above, each of the plurality of subsidiary circuits 5, 7 and 9 in the logical circuit 2 is provided with an error checking circuit 4, 6 or 8, which checks whether or not an error has occurred in that subsidiary circuit 5, 7 or 9. The error checking circuit 4, 6 or 8 is able to detect a hardware error (for example, an error caused by the semiconductor switch 41 changing independently between on and off). Below, an error detected by the error checking circuit 4, 6 or 8 is called a "hard error", in order to distinguish it from a soft error. A detected hard error is an error in one of the subsidiary circuits 5, 7, or 9, or in other words, an error which has a high probability of affecting data transfer between a host device 1 and a HDD 150. If at least one of the error checking circuits 4, 6, or 8 detects a hard error, then an error report is input to the OR circuit 11. Accordingly, the error report from the OR circuit 11 is stored in the first FF 19. The CPU 215 monitors whether or not a hard error has occurred, in other words, whether or not an error report has been stored in the first FF 19, at regular or irregular intervals.

On the basis of the foregoing, if an interrupt signal is input before the storing of an error report, then the CPU 215 will detect a soft error before the hard error. Conversely, if the storing of an error report is detected before the inputting of an interrupt signal, then the CPU 215 will detect the hard error before the soft error. The CPU 215 changes the processing implemented in accordance with the type of error that it detected first.

Figure 6:
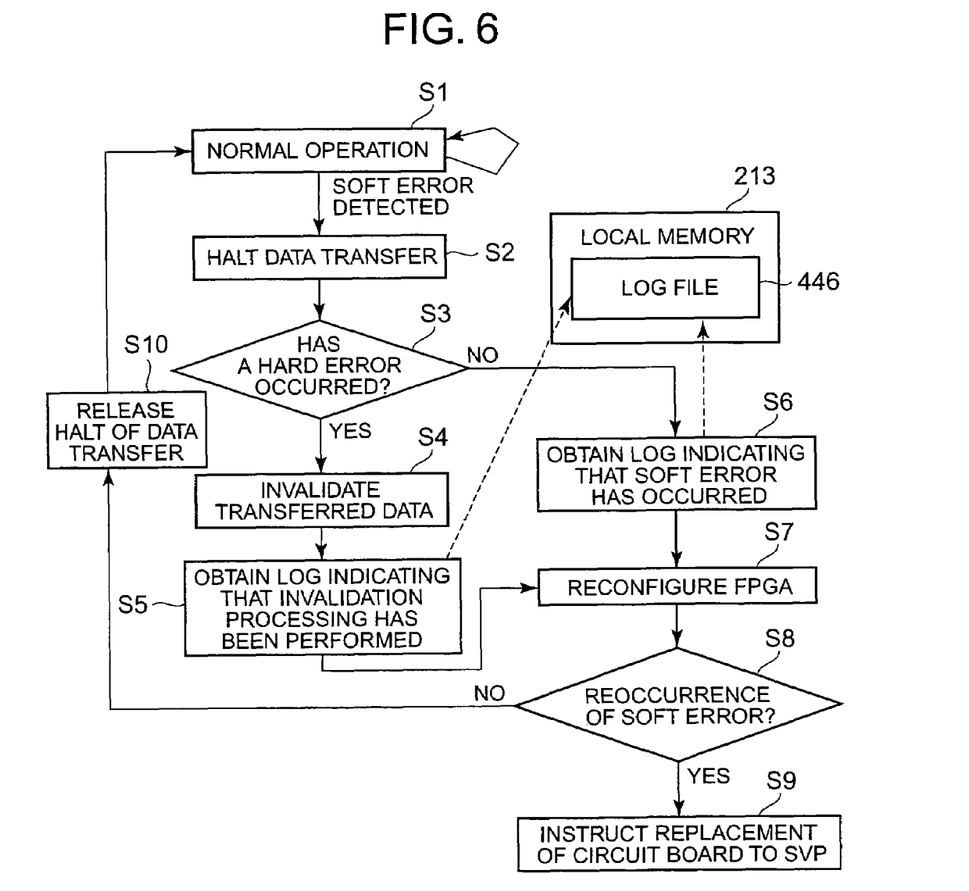
FIG. 6 shows one example of the sequence of processing carried out in a case where a soft error is detected before a hard error.

FIG. 6 shows one example of the sequence of processing carried out in a case where a soft error is detected before a hard error. The operations carried out by the CPU 215 in the following description may be performed by means of the CPU 215 executing the control program 214, for example.

During operation of the CHA 110 (step S1), if a soft error is detected before a hard error, then the CPU 215 located on one of the data transfer systems 220A halts data transfer (S2). More specifically, for example, the CPU 215 halts data transfer by changing the set value of the port (not illustrated) of the CHA 110 to a prescribed value. Consequently, the data transfer system 220A where the CPU 215 is located ceases to perform data transfer, and data transfer is carried out by the other data transfer system 220B only (so-called "degraded operation"). In other words, the access path via the data transfer system 220A (for example, the logical path constituted by the port number and the LDEV number) is closed off, but the access path via the data transfer system 220B is not closed off.

Next, the CPU 215 detects whether or not a hard error has occurred in the logical circuit 2 (S3). More specifically, for example, the CPU 215 accesses the first FF 19 via the CPU bus and checks whether or not an error report has been stored in the first FF 19.

If, as a result of S3, it is detected that a hard error has occurred (YES at S3), then the CPU 215 executes an invalidation process in order to invalidate the data which has been transferred (S4). The data to be invalidated is, at least, the data transferred up to the time at which the soft error was detected, from a time prior to the detection of the soft error by the fixed time period. Here, a "time prior to the detection of the soft error by the fixed time period" means, for example, the time at which the absence of a hard error was detected in the operation immediately before detecting the occurrence of a soft error. The CPU 215 records the designated range of data that is transferred at each timing (for instance, every 100 milliseconds), (for example, a set comprising a timing and access range information (such as the logical block address and LDEV number)), in a prescribed storage area of the local memory 213, or the like, and by referring to this storage area, it is able to identify the data transferred between a time point prior to the detection of the soft error by the fixed time period, and the time point at which the soft error was detected, in other words, it is able to identify the data which is to be invalidated. The CPU 215 is able to report the identified data to the host device 1 which was the communicating device until the halt of data transfer at S2, either actively, or in response to an enquiry from the host device 1. Accordingly, it is possible for the invalidated data to be retransmitted from the host device 1, or for invalidated data which has been read out to the host device 1 to be deleted from the host device 1. Furthermore, if the CPU 215 has identified that the invalidated data is stored in a certain HDD 150, then it is possible to delete that data from the particular HDD 150.

When the invalidation processing in S4 is carried out, the CPU 215 is able to obtain a log indicating that invalidation processing has been performed (S5). More specifically, for example, the CPU 215 is able to write the fact that invalidation processing has been performed, to a log file 446 located on the local memory 213.

Thereafter, the CPU 215 reconfigures the FPGA 217 (S7). In other words, the CPU 215 reboots the FPGA 217. More specifically, for example, the CPU 215 sets a reconfiguration instruction (by raising a prescribed flag, for instance) in the second FF 21 (see FIG. 3). Accordingly, this setting is detected by the configuration RAM 13, for example. In this case, for instance, a reset signal is output from the configuration RAM 13 to the reset circuit 219, and the reset circuit 219 disables the reception of access requests by the protocol chip 211. During this, circuit configuration information is read in from the configuration ROM 15 to the configuration RAM 243 13, and a logical circuit 2 is reconfigured on the circuit element group 3, in accordance with the circuit configuration information read in to the configuration RAM 243 13. Subsequently, a reset cancellation signal is output from the configuration RAM 13 to the reset circuit 219, and the reset circuit 219 enables the reception of access requests by the protocol chip 211.

If a soft error still appears to occur (YES at S8), even after carrying out S7, then the CPU 217 outputs to the SVP 281 an instruction to replace the circuit board of the CHA 110 on which it is installed (S9). Accordingly, an instruction message for replacement of the CHA 110 board is displayed on the display screen of the SVP 281, for example, and a maintenance operator is able to replace the CHA 110 in accordance with this instruction message.

If a soft error does not reoccur as a result of performing step S7, (NO at S8), then the CPU 217 restarts normal operation. More specifically, for example, if no interrupt signal has been input even after a prescribed time period has elapsed after completion of S7, then the CPU 217 cancels the halting of data transfer implemented at S2 (by, for instance, returning the port setting value to its original value) (S10). Consequently, normal operation is restarted in the data transfer system 220A (S1).

If, as a result of S3, a hard error is not detected (NO at S3), then the CPU 215 obtains the log indicating that a soft error has occurred (S6). More specifically, for example, the CPU 215 is able to write the fact that a soft error has occurred, to a log file 446 located on the local memory 213. Thereafter, the CPU 215 carries out step S7 described above.

Figure 7:
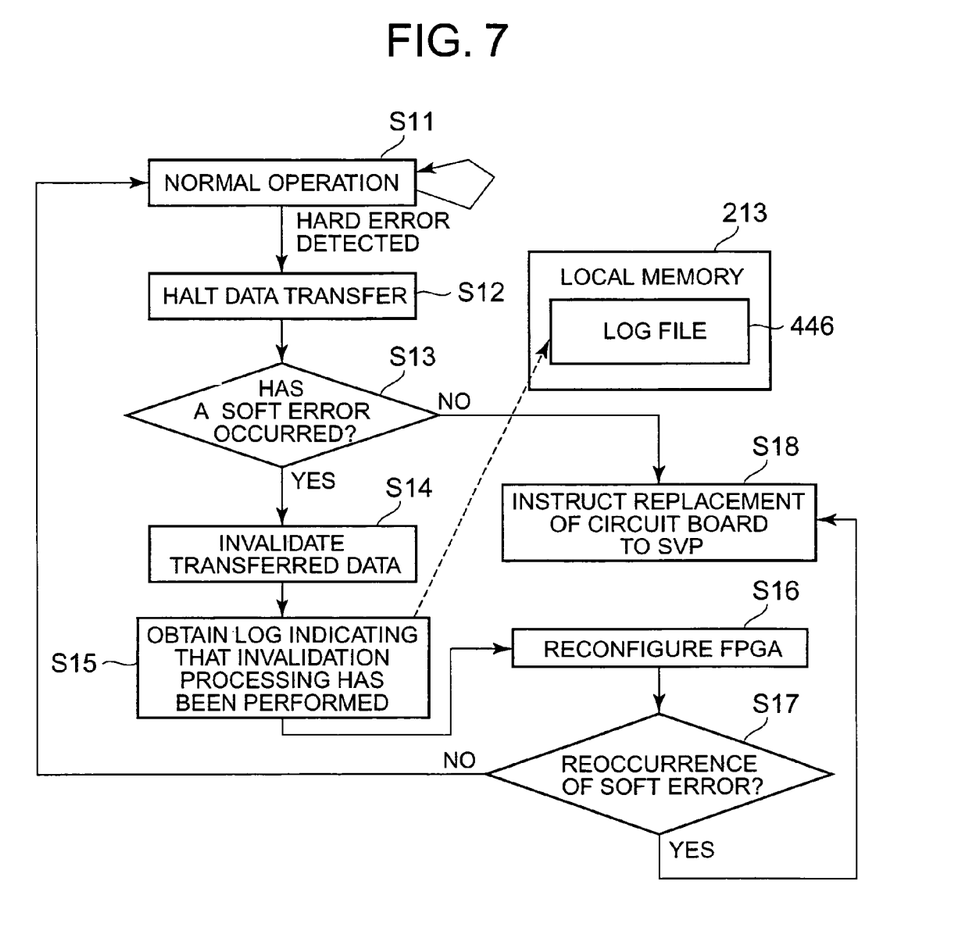
FIG. 7 shows one example of the sequence of processing carried out in a case where a hard error is detected before a soft error.

FIG. 7 shows one example of the sequence of processing carried out in a case where a hard error is detected before a soft error.

During the operation of the CHA 110 (S11), if the CPU 215 detects a hard error before a soft error, then it halts data transfer (S12).

Next, the CPU 215 detects whether or not a soft error has occurred in the configuration RAM 13 (S13). More specifically, for example, the CPU 215 waits for the input of an interrupt signal, during a prescribed time period after S12.

If the CPU 215 detects the occurrence of a soft error (YES at S13), then it is able to carry out similar processing to that described in S4, S5, S7, S8 and S9 above (S14-S18).

On the other hand, if no soft error is detected (NO at S13), then the CPU 215 carries out processing similar to that in S9 (S18).

Figure 8:
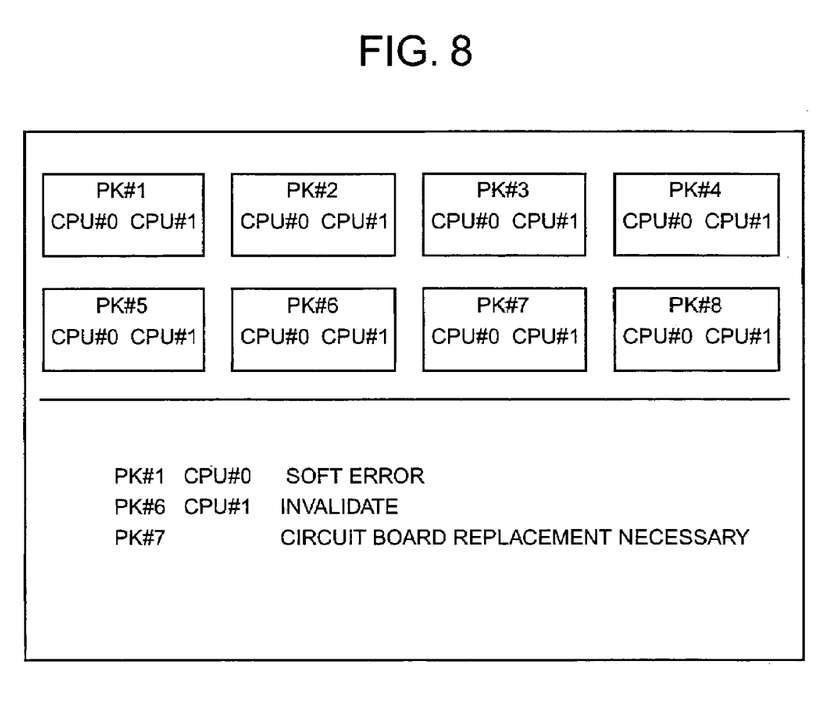
FIG. 8 shows one example of a screen displayed by an SVP 281.

FIG. 8 shows one example of a screen displayed by the SVP 281 on the basis of a board replacement instruction at step S9 in FIG. 6 or step S18 in FIG. 7.

The screen in FIG. 8 shows an example in which the hard errors and soft errors recorded in the log file 446 are displayed together. In FIG. 8, "PK" is an abbreviation of "package", and specifically, it indicates the CHAs 110 and DKAs 120. More specifically, PK#1-PK#4 indicate CHAs 110, and PK#5-PK#8 indicate DKAs 120. Therefore, according to FIG. 8, for example, it can be seen that PK#7 (DKA120) needs replacement. Furthermore, at CPU#0 of PK#1 (CHA 110), it can be seen that a hard error has not been detected, but that a soft error has been detected. From CPU#1 in PK#6 (DKA 120), it can be seen that the invalidation processing in S4 has been carried out.

The foregoing description related to the present embodiment.

According to the embodiment described above, the circuit configuration information loaded into the configuration RAM 13 of the FPGA 217 contains information for configuring an error checking circuit which checks whether or not a hardware error has occurred in a logical circuit 2 which is carrying out data transfer, and error checking circuits are configured in accordance with this information. If it is detected that a soft error has occurred in the configuration RAM 13 then it is determined whether or not the error checking circuits of the logical circuit 2 have detected a hard error, and different control sequences are implemented depending on the result of this determination. For example, if only a soft error has been detected, then the FPGA 217 is rebooted without carrying out data invalidation processing, and if the occurrence of the soft error ceases to be detected as a result of this process, then normal operation is restarted, without replacing the circuit board (CHA 110 or DKA 120) on which the FPGA 217 is provided. Consequently, the length of time during which degraded operation is performed in the storage system 100 can be restricted in comparison with a method in which recovery from a soft error is carried out by replacing the circuit board, each time a soft error is detected.

In the foregoing, several desirable embodiments of the present invention were described, but the present invention is not limited to these embodiments, and it may of course be modified in various ways without departing from the essence of the invention.

For example, in FIG. 6, if the occurrence of a soft error has been detected and, in a first check, the occurrence of a hard error has not been detected, then it is possible to carry out a check of whether or not a hard error has occurred, a prescribed number of times, or any number of times within a prescribed time period from the detection of the occurrence of a soft error.

Furthermore, for example, in FIG. 6, when the occurrence of a soft error has been detected, the CPU 215 implements a reboot of the FPGA 217 only in cases where the occurrence of a hard error has also been detected, whereas if a hard error has not been detected, then rebooting of the FPGA 217 may be avoided during at least the current loop (in other words, during that same loop).

Moreover, for example, the SVP 281 may collate log files 446 from the respective CHAs 110 and DKAs 120, at regular or irregular intervals, and the collated log files 446 may be stored in a storage resource of the SVP 281 (for example, a memory or hard disk).

Furthermore, for example, a plurality of types of circuit configuration information may be included in the configuration ROM 15 and one type of circuit configuration information (for instance, circuit configuration information selected by the SVP 281 or the host device 1) of the plurality of types of circuit configuration information may be loaded into the configuration RAM 13. Moreover, data indicating the type of circuit configuration information read out (for example, a circuit configuration information number) may be stored in a prescribed storage area of the FPGA 217, and the type of circuit configuration information indicated by the data stored in this storage area may be selected from the configuration ROM 15 and loaded into the configuration RAM 13 when the FPGA 217 is rebooted.

What is claimed is:

1. A storage system for transmitting data to and receiving data from other devices, said storage system comprising:

a media drive that stores transmitted and received data;

a PLD (Programmable Logic Device) for controlling data transfer between said other devices and said media drive; and a processor, wherein said PLD comprises:

a memory for storing circuit configuration information indicating the configuration of a logical circuit, input from an information source located externally to said PLD, wherein if a soft error occurs in said memory, then said memory provides an interrupt signal to said processor;

a circuit element group comprising a plurality of circuit elements; and a logical circuit for controlling said data transfer, configured on said circuit element group in accordance with the circuit configuration information in said memory, wherein said logical circuit comprises a plurality of subsidiary circuits and a plurality of error checking circuits, each of said plurality of subsidiary circuits including one of said plurality of error checking circuits, which check whether a hardware error has occurred in a corresponding subsidiary circuit, and wherein if at least one of said error checking circuits detects a hardware error, then an error report is stored, and wherein said processor:

detects that said soft error has occurred in said memory if said interrupt signal is received by said processor from said memory;

detects that said hardware error has occurred in said logical circuit if said error report is stored; and implements control based on which of said soft error and said hardware error the processor detects first.

2. The storage system according to claim 1, wherein said processor further:

halts the transfer of data carried out via the logical circuit, if it detects that a soft error or a hardware error in said logical circuit has occurred;

reconfigures said logical circuit, if at least said soft error is detected; and restarts the transfer of said data if said soft error has not been detected after a prescribed time period has elapsed since the reconfiguration of said logical circuit.

3. The storage system according to claim 2, wherein said processor instructs replacement of said PLD or a circuit board on which said PLD is provided, if it is detected that a soft error has occurred in said memory within a prescribed time period after reconfiguration of said logical circuit.

4. The storage system according to claim 1, wherein said processor halts the transfer of data carried out via the logical circuit, if it detects that a soft error or a hardware error in said logical circuit has occurred; and if it detects that a hardware error has occurred in at least said logical circuit, said processor implements invalidation processing for invalidating particular data which has been transmitted and received up to the detection of the soft error from a time prior to the detection of the soft error by the prescribed time period.

5. The storage system according to claim 1, wherein, if said soft error has been detected but the occurrence of a hardware error in said logical circuit has not been detected, said processor writes the fact that said soft error has occurred, to a prescribed storage area.

6. The storage system according to claim 1, wherein data transfer systems provided with said PLD and said processor are multiplexed, wherein in a certain data transfer system, the processor halts the transfer of data carried out via the logical circuit, if it detects that the soft error or the error in said logical circuit has occurred, and wherein even if transfer of data has been halted in said certain data transfer system, the other data transfer system performs data transfer via the logical circuit in that data transfer system.

7. A method for controlling a device having a PLD (Programmable Logic Device), said PLD comprising a memory for storing information input from an information source located externally to the PLD, a circuit element group comprising a plurality of circuit elements, and a logical circuit configured on said circuit element group in accordance with the information in said memory, wherein said method comprises:

providing an interrupt signal to said processor if a soft error occurs in said memory;

checking whether a hardware error has occurred in at least one subsidiary circuit of said logical circuit, and storing an error report if a hardware error is detected in at least one subsidiary circuit of said logical circuit;

detecting that said soft error has occurred in said memory if said interrupt signal is received by said Processor;

detecting that said hardware error has occurred in said logical circuit if said error report is stored; and implementing control based on which of said soft error and said hardware error the processor detects first.

8. A computer program to be executed by a computer having a PLD (Programmable Logic Device), said PLD comprising a memory for storing information input from an information source located externally to the PLD, a circuit element group comprising a plurality of circuit elements, and a logical circuit configured on said circuit element group in accordance with the information in said memory, wherein said computer program causes a processor to execute the steps of:

providing an interrupt signal to said processor if a soft error occurs in said memory;

checking whether a hardware error has occurred in at least one subsidiary circuit of said logical circuit, and storing an error report if a hardware error is detected in at least one subsidiary circuit of said logical circuit;

detecting that said soft error has occurred in said memory if said interrupt signal is received by said processor;

detecting that said hardware error has occurred in said logical circuit if said error report is stored; and implementing control based on which of said soft error and said hardware error the processor detects first.

* * * * *